United States Patent
Rosenblatt et al.

(10) Patent No.: US 10,784,432 B2
(45) Date of Patent: *Sep. 22, 2020

(54) VERTICAL JOSEPHSON JUNCTION SUPERCONDUCTING DEVICE

(71) Applicant: International Business Machines Corporation, Armonk, NY (US)

(72) Inventors: Sami Rosenblatt, White Plains, NY (US); Markus Brink, White Plains, NY (US); Rasit Onur Topaloglu, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/246,676

(22) Filed: Jan. 14, 2019

(65) Prior Publication Data

US 2019/0296212 A1    Sep. 26, 2019

Related U.S. Application Data

(63) Continuation of application No. 15/934,400, filed on Mar. 23, 2018, now Pat. No. 10,243,132.

(51) Int. Cl.
*H01L 39/22* (2006.01)
*H01L 39/24* (2006.01)
(Continued)

(52) U.S. Cl.
CPC ............ *H01L 39/223* (2013.01); *B82Y 10/00* (2013.01); *H01L 27/18* (2013.01); *H01L 39/12* (2013.01);
(Continued)

(58) Field of Classification Search
CPC ... H01L 39/223; H01L 39/025; H01L 39/228; H01L 39/2493; H03K 19/195
See application file for complete search history.

(56) References Cited

U.S. PATENT DOCUMENTS

| | | |
|---|---|---|
| 5,366,953 A | 11/1994 | Char et al. |
| 5,385,883 A | 1/1995 | Lenzing et al. |

(Continued)

FOREIGN PATENT DOCUMENTS

| | | |
|---|---|---|
| WO | 2017015432 | 1/2017 |
| WO | 2017/217961 A1 | 12/2017 |

OTHER PUBLICATIONS

Office Action for U.S. Appl. No. 15/934,348 dated Apr. 22, 2019, 29 pages.
(Continued)

*Primary Examiner* — Zandra V Smith
*Assistant Examiner* — Andre C Stevenson
(74) *Attorney, Agent, or Firm* — Amin, Turocy & Watson, LLP

(57) ABSTRACT

Techniques for a vertical Josephson junction superconducting device are provided. In one embodiment, a chip surface base device structure is provided that comprises a substrate comprising crystalline silicon that is coupled with a first superconducting layer, wherein the first superconducting layer is coupled with a second substrate comprising crystalline silicon. In one implementation, the chip surface base device structure also comprises a vertical Josephson junction located in an etched region of the substrate, the vertical Josephson junction comprising a first superconducting layer, a tunnel barrier layer, and a top superconducting layer.

20 Claims, 14 Drawing Sheets

(51) Int. Cl.
  *H03K 19/195*  (2006.01)
  *H01L 39/12*  (2006.01)
  *B82Y 10/00*  (2011.01)
  *H01L 27/18*  (2006.01)
  *H01L 39/02*  (2006.01)
  *B82Y 40/00*  (2011.01)
  *G06N 10/00*  (2019.01)

(52) U.S. Cl.
  CPC ........ *H01L 39/228* (2013.01); *H01L 39/2493* (2013.01); *H03K 19/195* (2013.01); *B82Y 40/00* (2013.01); *G06N 10/00* (2019.01); *H01L 39/025* (2013.01)

(56) References Cited

U.S. PATENT DOCUMENTS

| | | |
|---|---|---|
| 5,476,719 A | 12/1995 | Sandell et al. |
| 5,523,282 A | 6/1996 | Simon et al. |
| 5,910,662 A | 6/1999 | Itozaki et al. |
| 6,348,699 B1 | 2/2002 | Zehe |
| 6,734,454 B2 | 5/2004 | Van Duzer et al. |
| 6,818,549 B2 | 11/2004 | Fricke et al. |
| 6,823,201 B2 | 11/2004 | Kai et al. |
| 6,979,836 B2 | 12/2005 | Zagoskin et al. |
| 7,888,746 B2 | 2/2011 | Tischler |
| 8,148,715 B2 | 4/2012 | Hollenberg et al. |
| 9,324,767 B1 | 4/2016 | Steinbach et al. |
| 9,397,283 B2 | 7/2016 | Abraham et al. |
| 9,425,377 B2 | 8/2016 | Moyerman et al. |
| 9,455,391 B1 * | 9/2016 | Nayfeh ............ G11C 11/44 |
| 9,501,748 B2 | 11/2016 | Naaman et al. |
| 9,520,547 B2 | 12/2016 | Abraham et al. |
| 9,741,918 B2 | 8/2017 | Yohannes et al. |
| 9,768,371 B2 | 9/2017 | Ladizinsky et al. |
| 10,243,132 B1 * | 3/2019 | Rosenblatt ............ H01L 39/223 |
| 10,256,392 B1 | 4/2019 | Brink et al. |
| 2001/0035524 A1 | 11/2001 | Zehe |
| 2004/0104449 A1 | 6/2004 | Yoon et al. |
| 2005/0123674 A1 | 6/2005 | Stasiak et al. |
| 2008/0032501 A1 | 2/2008 | Klein et al. |
| 2015/0357550 A1 | 12/2015 | Schoelkopf, III et al. |
| 2015/0372217 A1 | 12/2015 | Schoelkopf, III et al. |
| 2016/0104073 A1 | 4/2016 | Sandberg et al. |
| 2017/0133336 A1 | 5/2017 | Oliver et al. |
| 2017/0133576 A1 | 5/2017 | Marcus et al. |
| 2017/0148972 A1 | 5/2017 | Thompson et al. |
| 2017/0179193 A1 | 6/2017 | Tolpygo |
| 2017/0186935 A1 | 6/2017 | Bonetti et al. |
| 2018/0040800 A1 * | 2/2018 | Chang ............ H01L 39/2493 |
| 2018/0138389 A1 | 5/2018 | Kirby et al. |
| 2018/0232654 A1 * | 8/2018 | Epstein ............ H03K 19/195 |
| 2018/0287041 A1 * | 10/2018 | Abdo ............ H01L 39/2493 |
| 2019/0363239 A1 * | 11/2019 | Yoscovits ............ H01L 27/18 |

OTHER PUBLICATIONS

International Search Report and Written Opinion received for PCT Application Serial No. PCT/EP2019/054836 dated Jun. 28, 2019, 17 pages.
International Search Report and Written Opinion received for PCT Application Serial No. PCT/EP2019/054837 dated Jun. 28, 2019, 15 pages.
International Search Report and Written Opinion received for PCT Application Serial No. PCT/EP2019/054839 dated Jun. 28, 2019, 16 pages.
Office Action for U.S. Appl. No. 15/934,348 dated Sep. 9, 2019, 21 pages.
Braumuller et al., "Concentric transmon qubit featuring fast tunability and an anisotropic magnetic dipole moment," arXiv:1509.08014v3 [quant-ph], Jan. 2016, 10 pages.
Mariantoni et al., "Two-resonator circuit quantum electrodynamics: A superconducting quantum switch," Physical Review B, 78, 2008, 22 pages.
Defeo et al., "Microstrip Superconducting Quantum Interference Devices for Quantum Information Science," Doctoral dissertation, Syracuse University, 2012, 183 pages.
Mantl, "Compound formation by ion beam synthesis and a comparison with alternative methods such as deposition and growth or wafer bonding," Nuclear Instruments and Methods in Physics Research B 106, 1995, 9 pages.
Schoelkopf et al., "Final Report: Materials Limits on Coherence in Charge Qubits," IARPA CSQ project at Yale University, Jun. 2, 2015, 26 pages.
Koch et al., "Charge-insensitive qubit design derived from the Cooper pair box," Physical Review A, 76(4), 2007, 19 pages.
Grimm et al., "A self-aligned nano-fabrication process for vertical NbN—MgO—NbN Josephson junctions," arXiv:1705.05608v1 [cond-mat.mes-hall], May 16, 2017, 5 pages.
Lomatch et al., "Multilayered Josephson junction logic and memory devices," Proceedings of the SPIE—The International Society for Optical Engineering, vol. 2157, Jan. 1994, p. 332-343, 13 pages.
Island et al., "Thickness dependent interlayer transport in vertical MoS2 Josephson junctions," arXiv:1604.06944v2 [cond-mat.mes-hall] Jul. 1, 2016, 18 pages.
Notice of Allowance for U.S. Appl. No. 15/934,400 dated Oct. 31, 2018, 21 pages.
List of IBM Patents or Applications Treated as Related.
Office Action for U.S. Appl. No. 16/248,141 dated Nov. 29, 2019, 22 pages.

* cited by examiner

1300

1302 — BONDING A FIRST PORTION OF A SUPERCONDUCTING LAYER THAT IS PHYSICALLY COUPLED WITH A CRYSTALLINE SILICON SUBSTRATE WITH A SECOND PORTION OF THE SUPERCONDUCTING LAYER THAT IS PHYSICALLY COUPLED WITH A SECOND CRYSTALLINE SILICON SUBSTRATE, THE CRYSTALLINE SILICON SUBSTRATE, THE SUPERCONDUCTING LAYER, AND THE SECOND CRYSTALLINE SILICON SUBSTRATE COMPRISING A SILICON-ON-METAL (SOM) BASE

1304 — FORMING A VERTICAL JOSEPHSON JUNCTION IN AN ETCHING OF THE CRYSTALLINE SILICON SUBSTRATE, THE VERTICAL JOSEPHSON JUNCTION COMPRISING THE SUPERCONDUCTING LAYER, A TUNNEL BARRIER LAYER, AND A SECOND SUPERCONDUCTING LAYER

Fig. 13

VERTICAL JOSEPHSON JUNCTION SUPERCONDUCTING DEVICE

BACKGROUND

The subject disclosure relates to superconducting devices, and more specifically, to fabricating a vertical Josephson junction superconducting device using a silicon-on-metal (SOM) substrate.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits that comprise superpositions of both 0 and 1, can entangle multiple quantum bits, and use interference to obtain computational results.

Quantum computing hardware can be different from classical computing hardware. In particular, superconducting quantum circuits generally rely on Josephson junctions, which can be fabricated in a semiconductor device. A Josephson junction generally manifests the Josephson effect of a supercurrent, where current can flow indefinitely across a Josephson junction without an applied voltage. A Josephson junction can be created by weakly coupling two superconductors (a material that conducts electricity without resistance), for example, by a tunnel barrier as described below.

Some prior art Josephson junctions can be implemented using shadow evaporation. A problem with fabricating prior art Josephson junctions using shadow evaporation can be that this approach is not scalable, because shadow evaporation can produce non-uniform results on larger substrates, such as 200 mm or 300 mm wafers. Josephson junctions implemented via shadow evaporation can have high variability of the supercurrent. Josephson junctions implemented via shadow evaporation can be made with a lift-off process, which, in turn, can cause flares at the edges of a remaining superconducting layer, can allow for one or more floating superconducting islands to be formed near a Josephson junction (where using undercut in resist, or hard mask, profile); and can have some junction variability (which causes variability of the critical current) caused by undercut and small misalignments in tilted evaporation. Additionally, a problem with shadow evaporation is that a number of choices for both materials and deposition approaches can be limited.

There are also Josephson junctions used in single flux quantum (SFQ) computing, which can be vertical, but can have a problem of having an associated loss beyond what is suitable for quantum computing. This associated loss with a SFQ junction can include both loss due to surrounding dielectrics with insufficient loss tangent, and loss in tunnel barrier. Additionally, a SFQ junction generally has a larger area than a quantum bit (qubit) junction.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, chip surface base device structures, computer-implemented methods, apparatus and/or computer program products that facilitate vertical Josephson junction superconducting devices are described.

According to an embodiment, a chip surface base device structure is provided. In one example, the chip surface base device structure comprises a substrate comprising crystalline silicon that is physically coupled with a first superconducting layer, wherein the first superconducting layer is physically coupled with a second substrate comprising crystalline silicon. In one or more implementations, the chip surface base device structure can further comprise a vertical Josephson junction located in an etched region of the substrate, the vertical Josephson junction comprising the first superconducting layer, a tunnel barrier layer, and a top superconducting layer. An advantage of such a chip surface base device structure can be that the structure contains vertical Josephson junctions that are more uniform than Josephson junctions from previous techniques.

In some examples, the tunnel barrier layer is located on at least one of the first superconducting layer, or a second superconducting layer that is coupled with the first superconducting layer. An advantage of depositing the tunnel barrier layer in this manner can be that such a chip surface base device structure is more reproducible than a chip surface base device structure with a differently positioned tunnel barrier layer.

In another embodiment, a method is provided. In one example, the method comprises physically coupling a substrate comprising crystalline silicon with a first superconducting layer. The method can further comprise physically coupling the first superconducting layer with a second substrate comprising crystalline silicon. The method can further comprise etching the substrate. The method can further comprise forming a vertical Josephson junction in the etching of the substrate, the vertical Josephson junction comprising the first superconducting layer, a tunnel barrier layer, and a top superconducting layer. An advantage of such a method can be that it can be used to fabricate vertical Josephson junctions that are more uniform than Josephson junctions fabricated from previous techniques.

In some examples, the method further comprises depositing a second superconducting layer between the first superconducting layer and the tunnel barrier layer. An advantage of depositing the second superconducting layer in this manner can be that a height of the second superconducting layer can be used to set a height of the tunnel base layer in the via.

In another embodiment, a chip surface base device structure is provided. In one example, the chip surface base device structure comprises a first portion of a superconducting layer that is bonded with a second portion of the superconducting layer, the first portion of the superconducting layer being physically coupled to a substrate, and the second portion of the superconducting layer being physically coupled to a second substrate. In one or more implementations, the chip surface base device structure can further comprise a vertical Josephson junction located in an etched region of the substrate, the vertical Josephson junction comprising a tunnel barrier layer and a top superconducting layer. An advantage of such a chip surface base device structure can be that it contains vertical Josephson junctions that are more uniform than Josephson junctions from previous techniques.

In some examples, the tunnel barrier layer is formed on the superconducting layer. An advantage of forming the tunnel barrier layer on the first superconducting layer can be that such a chip surface base device structure is more reproducible than a chip surface base device structure with a differently positioned tunnel barrier layer.

In another embodiment, a method is provided. In one example, the method comprises bonding a first portion of a superconducting layer that is physically coupled to a crystalline silicon substrate with a second portion of the superconducting layer that is physically coupled with a second crystalline silicon substrate, the crystalline silicon substrate, the superconducting layer, and the second crystalline silicon substrate comprising a silicon-on-metal (SOM) base. The method can further comprise forming a vertical Josephson junction in an etching of the crystalline silicon substrate, the vertical Josephson junction comprising the superconducting layer, a tunnel barrier layer, and a second superconducting layer. An advantage of such a method can be that it can be used to fabricate vertical Josephson junctions that are more uniform than Josephson junctions fabricated from previous techniques.

In another embodiment, a chip surface base device structure is provided. In one example, the chip surface base device structure comprises a substrate comprising crystalline silicon that is physically coupled with a first superconducting layer, wherein the first superconducting layer is physically coupled with a second substrate comprising crystalline silicon; and a vertical Josephson junction that is formed in an etching of the substrate. An advantage of such a chip surface base device structure can be that it contains vertical Josephson junctions that are more uniform than Josephson junctions from previous techniques.

DESCRIPTION OF THE DRAWINGS

FIG. 13 illustrates another flow diagram of an example, non-limiting computer-implemented method that facilitates implementing a vertical Josephson junction superconducting device in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given the above problems with common implementations of Josephson junctions, the present disclosure can be implemented to produce a vertical Josephson junction computing device that provides a solution to one or more of those problems. Such a vertical Josephson junction computing device can have an advantage of improved scaling because of a reduced footprint relative to that of a non-vertical Josephson junction device. Such a vertical Josephson junction computing device can also have an advantage of providing more choices in both materials and deposition methods relative to a number of choices for a shadow evaporated overlap Josephson junction. Such a vertical Josephson junction computing device can have an advantage of fabrication scaling because the device is compatible with chip manufacturing approaches. Additionally, such a vertical Josephson junction computing device can have an advantage of being embedded in a very low loss environment.

Figure 1:
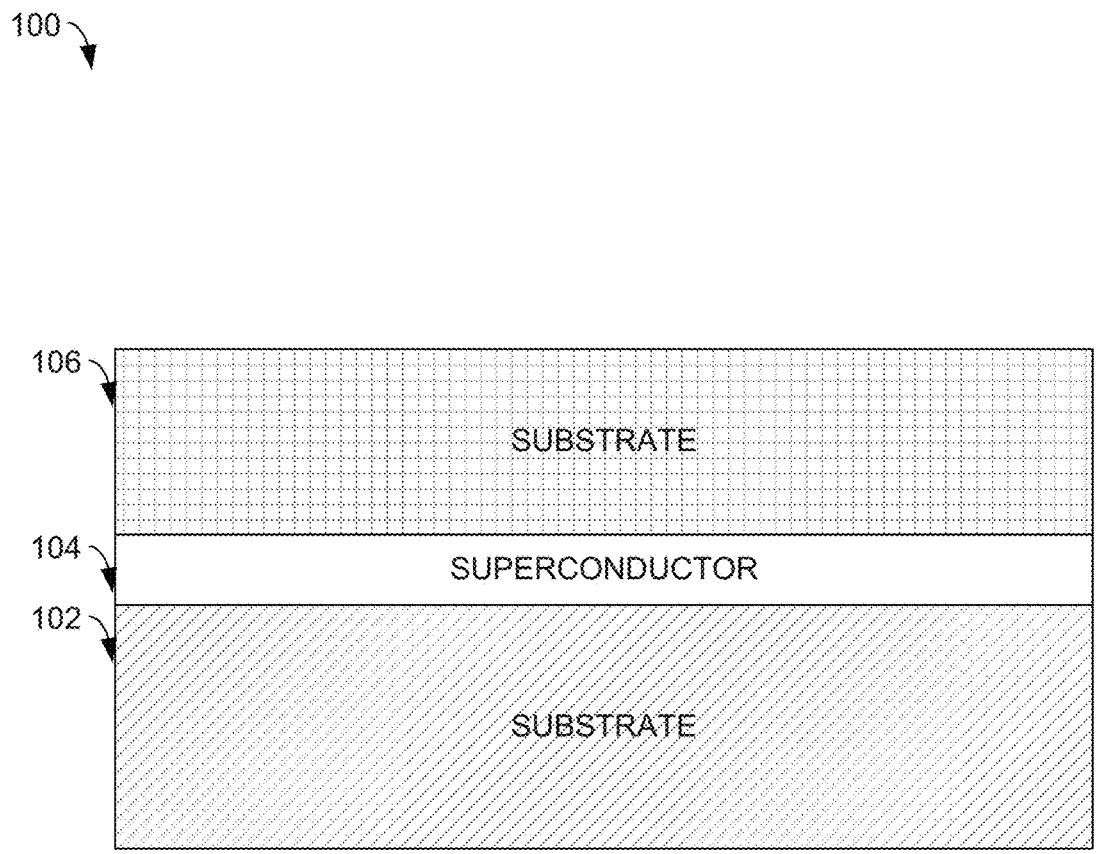
FIG. 1 illustrates an example, non-limiting chip surface base device structure in accordance with one or more embodiments described herein.

FIG. 1 illustrates an example, non-limiting chip surface base device structure in accordance with one or more embodiments described herein. As depicted, chip surface base device structure 100 comprises substrate 102, superconductor 104, and substrate 106. A chip surface base device structure can sometimes be referred to as a chip surface base device structure. Chip surface base device structure 100 can be considered to be a buried metal flow, where the metal is a superconducting material. Then, the top substrate layer—substrate 106—can be ground to a thickness of approximately 100-200 nm, either before or after substrate 106, superconductor 104, and substrate 102 are physically coupled together (as opposed to an electrical coupling, such as between two capacitive plates). In some examples, superconductor 104 can be titanium (Ti), tantalum (Ta), tungsten (W), or titanium nitride (TiN).

In some examples, substrate 102 and substrate 106 can have initial thicknesses of approximately 500 micrometers (μm) to 800 μm. Then, in some examples, the various materials used can be used in temperatures up to approximately 500 degrees Celsius (C). In some examples, materials with lower melting points, such as aluminum (Al) can be used, and these materials can begin to deform at approximately 300 C.

In some examples, one or both of substrate 102 and substrate 106 can be crystalline silicon (Si), and such a substrate can be referred to as a crystalline silicon substrate. The use of crystalline Si can improve a coherence time of a qubit associated with a vertical Josephson junction as described herein. Additionally, in some examples, a high-resistivity crystalline Si can be utilized, which can further improve coherence time. In some examples, this crystalline Si can be grown.

In some examples, a portion of superconductor 104 is deposited onto substrate 102, and a portion of superconductor 104 is deposited onto substrate 106. Then, these two portions of superconductor 104 can be bonded together to connect substrate 102 to superconductor 104 to substrate 106. Put another way, after depositing the respective portions of superconductor 104 on substrate 102 and substrate 106, respectively, the exposed surface of a first portion of superconductor 104 can then be bonded to the exposed surface of a second portion of superconductor 104. In some examples, bonding can be effectuated with a low-temperature anneal, or another adhesion approach.

Figure 2:
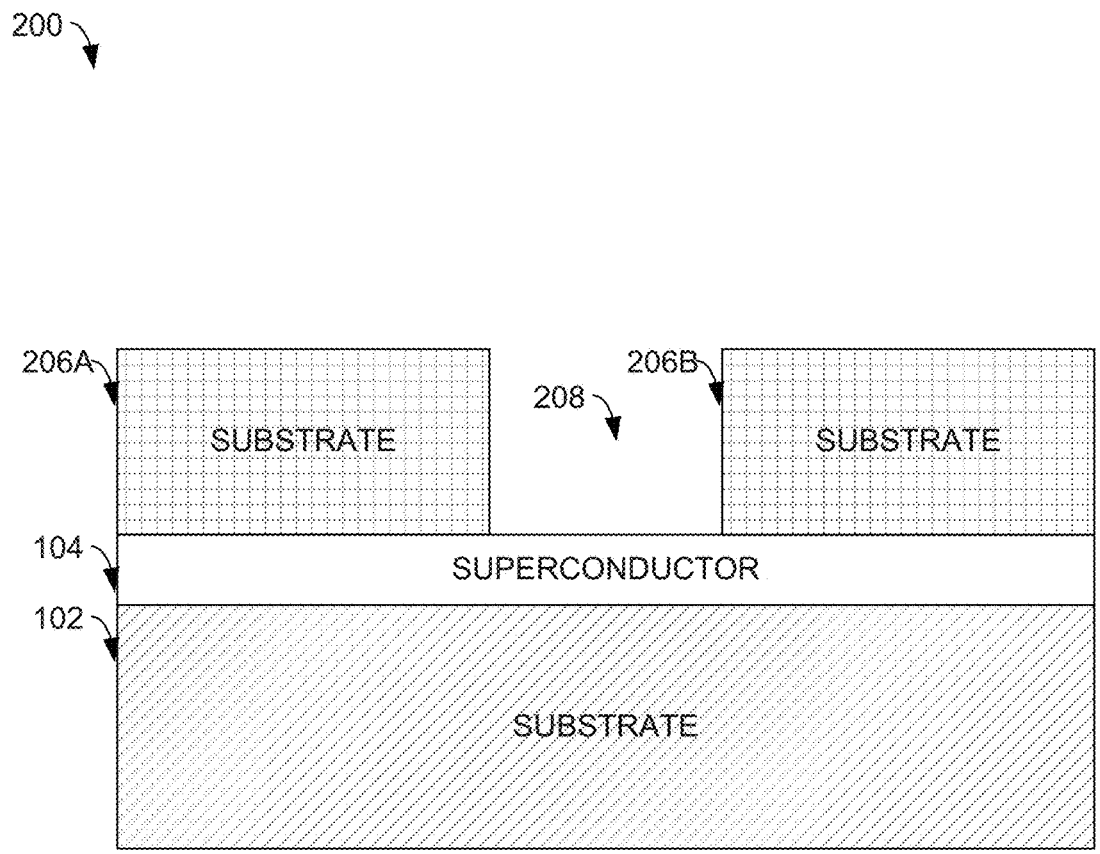
FIG. 2 illustrates the example, non-limiting chip surface base device structure of FIG. 1 after creation of a via in accordance with one or more embodiments described herein.

FIG. 2 illustrates the example, non-limiting chip surface base device structure of FIG. 1 after creation of via 208 in accordance with one or more embodiments described herein. As depicted, chip surface base device structure 200 reflects etching a via into substrate 106 of chip surface base device structure 100. A via 208 can generally comprise an opening through a layer of a chip base surface, through which a conductive connection between two other layers can be formed. Whereas chip surface base device structure 100 has substrate 106, here substrate 106 has been etched to form via 208, leaving substrate 206A and substrate 206B to remain from what was substrate 106 (with via 208 formed between substrate 206A and substrate 206B). The cross-sectional side view of chip surface base device structure 200 shows that substrate 206A and substrate 206B are separated. However, it can be appreciated that a hole has been formed in substrate 106, which is shown in this cross-sectional side view, and that substrate 206A and substrate 206B are still connected (e.g., from above, this substrate could look as if a hole was formed in the middle of it). Other materials in cross-sectional side views can be similarly attached though they appear to be separated in the cross-sectional side view. In some cases, via 208 can extend into the superconductor 104, meaning part of the top of superconductor 104 may be removed at the location of via 208.

In some examples, etch lithography can be implemented to etch via 208, with a depth of the via of 100-200 nm. In some examples, an aspect ratio of 1:1 between a height and a width of a via can be effectuated.

Figure 3:
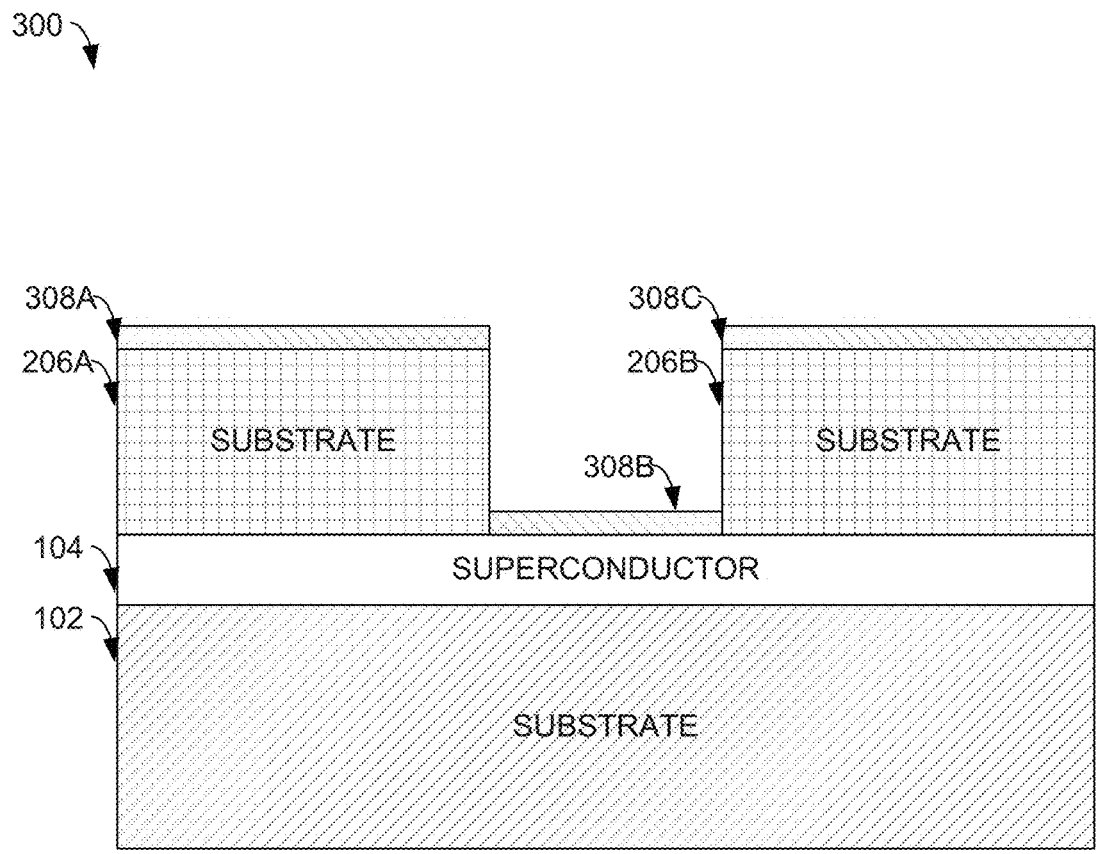
FIG. 3 illustrates the example, non-limiting chip surface base device structure of FIG. 2 after depositing a tunnel barrier layer in accordance with one or more embodiments described herein.

FIG. 3 illustrates the example, non-limiting chip surface base device structure of FIG. 2 after depositing a tunnel barrier layer in accordance with one or more embodiments described herein. As depicted with chip surface base device structure 300, a tunnel barrier layer has been deposited on chip surface base device structure 200, and this tunnel barrier layer comprises tunnel barrier 308A, tunnel barrier 308B, and tunnel barrier 308C.

In some examples, tunnel barrier 308A, tunnel barrier 308B, and tunnel barrier 308C can be deposited on chip surface base device structure 200 using a sputter approach, an evaporative approach, or an atomic layer deposition (ALD) approach. In some examples, tunnel barrier 308A, tunnel barrier 308B, and tunnel barrier 308C can be aluminum oxide ($Al_2O_3$), a non-superconducting metal (sometimes referred to as a "normal" metal), an oxide or a nitride. In some examples, the tunnel barrier 308B can be grown or chemically induced on the exposed surface (after etch) of superconductor 104, for example, by oxidation. Depending on the chemical sensitivity of substrate 206, the surface layers of tunnel barrier 308A and tunnel barrier 308C may or may not exist. Generally, a tunnel barrier layer can be a thin layer of non-conducting material.

It can be appreciated that additional steps can be performed on chip surface base device structure 300 to further produce a chip surface base device structure, similar to those described with respect to FIGS. 4-11. A difference between a chip surface base device structure created using chip surface base device structure 300 and a chip surface base device structure using chip surface base device structure 400 can be found in the presence of a second superconducting layer. In chip surface base device structure 400, a second superconducting layer is deposited below a tunnel barrier layer, and this second superconducting layer is omitted from chip surface base device structure 300.

An advantage of depositing or growing the tunnel barrier layer on the first superconducting layer can be that such a chip surface base device structure is more reproducible than a chip surface base device structure with a differently positioned tunnel barrier layer.

Figure 4:
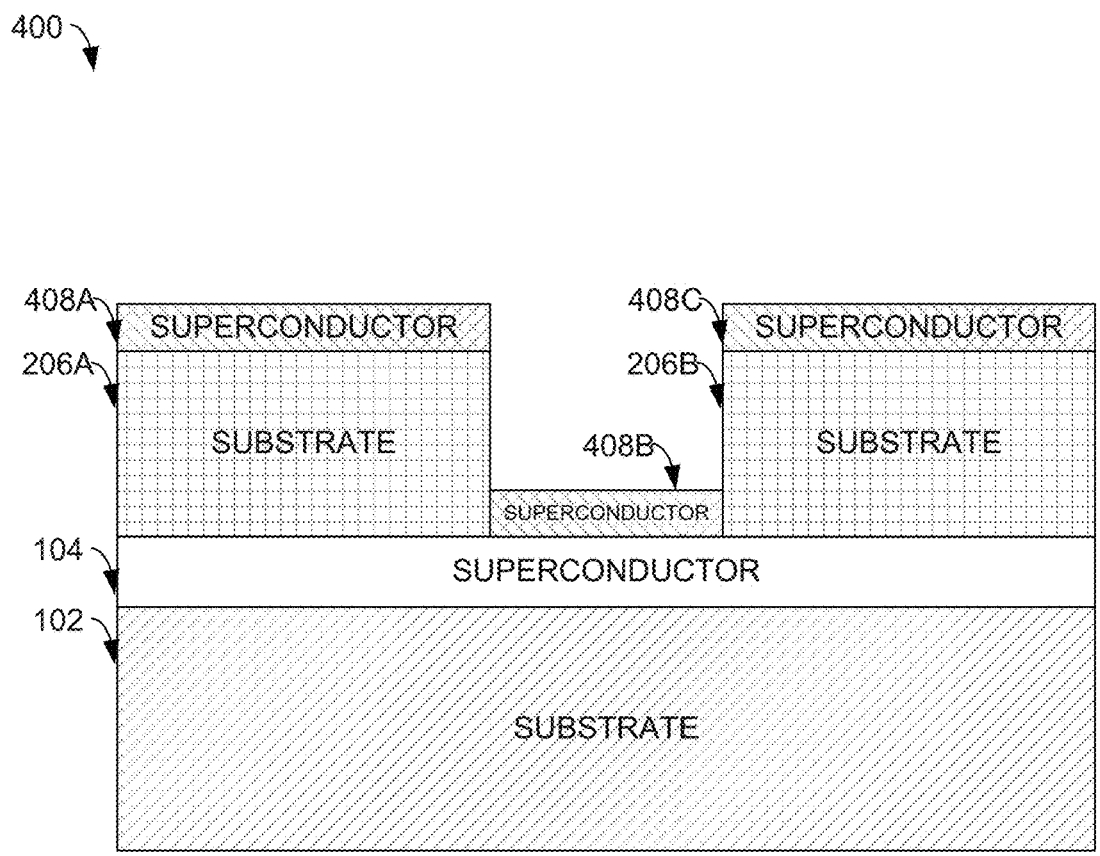
FIG. 4 illustrates the example, non-limiting chip surface base device structure of FIG. 2 after depositing a second superconductor in accordance with one or more embodiments described herein.

FIG. 4 illustrates the example, non-limiting chip surface base device structure of FIG. 2 after depositing a second superconductor in accordance with one or more embodiments described herein. As depicted with chip surface base device structure 400, a second superconductor has been deposited on chip surface base device structure 200, and this second superconducting layer comprises superconductor 408A, superconductor 408B, and superconductor 408C. Chip surface base device structure 400 can be considered to be an alternative embodiment relative to chip surface base device structure 300, where in each of these embodiments a different type of layer is deposited onto chip surface base device structure 200.

This second superconducting layer (superconductor 408A, superconductor 408B, and superconductor 408C) can be a different type of material than the first superconducting layer (superconductor 104), or it can be the same type of material as the first superconducting layer. In some examples, depositing this second superconducting layer may initially cause superconductor 408A, superconductor 408B, and superconductor 408C to be connected because some superconducting material is deposited on the interior sides of substrate 206A and substrate 206B. Where this occurs, an isotropic etch-back can be performed to disconnect superconductor 408A from superconductor 408B, and to disconnect superconductor 408B from superconductor 408C (i.e., to remove that portion of the superconducting material that is deposited on the interior sides of substrate 206A and substrate 206B). Alternatively, a lithographic patterning step can be performed in alignment with the previous etch step, and the material on the interior sides can be etched anisotropically (as for example with a reactive ion etch) while protecting the center of the via (and superconductor 408B) from the etch using resist (photoresist or electron-beam resist).

Adding superconductor 408B (and a height of superconductor 408B, or even whether to add superconductor 408B) can be used to determine a height of a vertical Josephson junction. The more of superconductor 408B that is added, the closer the vertical Josephson junction is to a top of the via, and the less of superconductor 408B that is added (or not adding superconductor 408B at all), the closer the vertical Josephson junction is to a bottom of the via. Beyond a vertical Josephson junction being formed at the bottom of a via, there can be examples where a vertical Josephson junction can be formed below the bottom of a via. That is, where a via is cleaned before depositing a tunnel barrier layer, this cleaning (e.g., an etching) can remove some material at the bottom of the via, further deepening it. Then, when the tunnel barrier layer is deposited, it can be deposited below the former bottom of the via.

Considerations that can be used to determine a placement of a vertical Josephson junction can include how the height of the vertical Josephson junction affects an ability to reproduce such a vertical Josephson junction in fabricating multiple vertical Josephson junctions, and an ability to attach particular materials used in a chip surface base device structure (such as an ability to attach the tunnel barrier layer with a material used for superconductor 104). For example, vertical Josephson junction with a tunnel barrier layer closer to a top of a via may result in less variability in fabricating multiple such vertical Josephson junctions.

In chip surface base device structure 400, superconductor 104 and superconductor 408B are touching, or next to, each other. In general, two superconductors that are placed next to each other in this arrangement or a similar arrangement behave as a single superconductor, and will exhibit a single superconducting phase even where the two superconductors are made up of different materials from each other.

In the course of depositing superconductor 408A, superconductor 408B, and superconductor 408C, some superconducting material can be deposited onto the sidewalls of the via—i.e., some superconducting material may connect superconductor 408A with superconductor 408B, and some superconducting material may connect superconductor 408B with superconductor 408C. This additional superconducting material on the sidewalls of the via can be removed. For example, it can be etched away, such as using a wet etch that is isotropic—i.e., the etch operates the same in all directions. Since the sidewall deposit is thinner by construction (though there can be embodiments where this is not true, such as with conformally grown techniques such as ALD) than that of superconductor 408A, superconductor 408B and superconductor 408C, the sidewall deposit can be etched faster while not etching away superconductor 408A, superconductor 408B and superconductor 408C. In other embodiments, a lithographic patterning step can be performed in alignment with the previous etch step, and the material on the interior sides can be etched anisotropically (as for example with a reactive ion etch) while protecting the center of the via (and superconductor 408B) from the etch using resist (photoresist or electron-beam resist).

Figure 5:
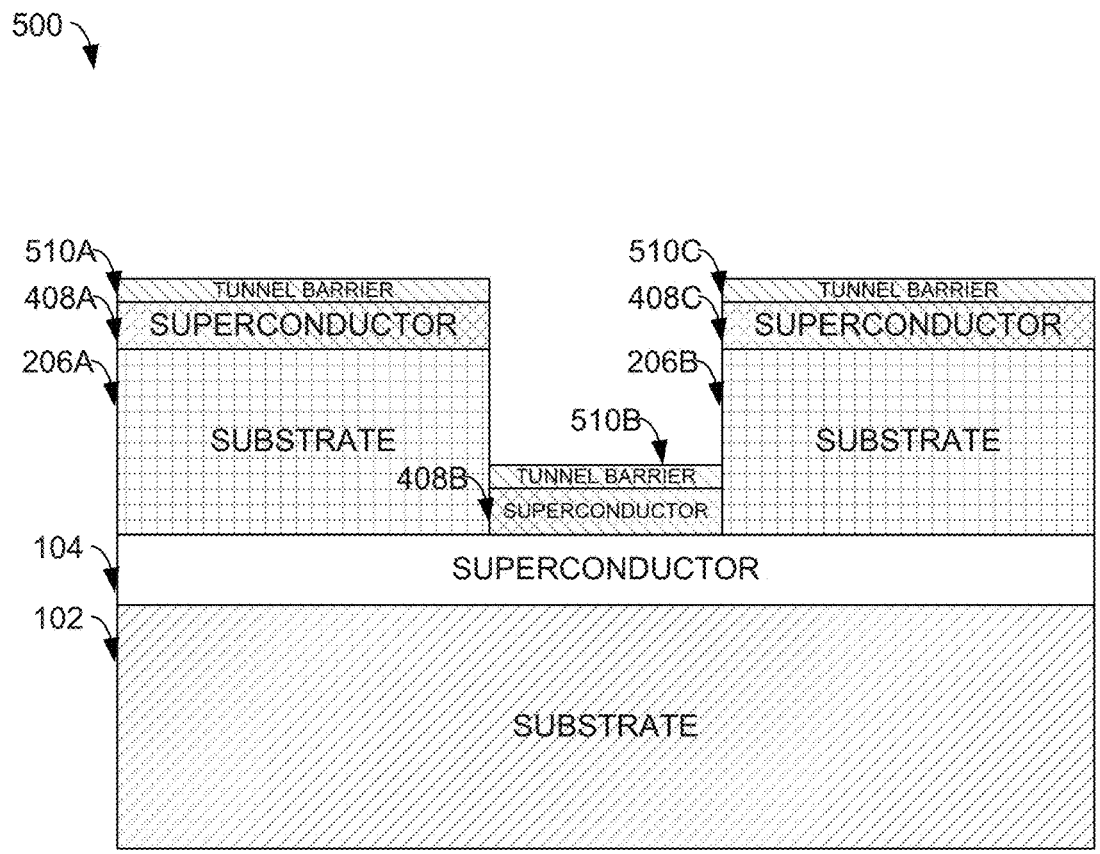
FIG. 5 illustrates the example, non-limiting chip surface base device structure of FIG. 4 after depositing a tunnel barrier layer in accordance with one or more embodiments described herein.

An advantage of depositing the second superconducting layer in this manner can be that a height of the second superconducting layer can be used to set a height of the tunnel base layer (that is deposited upon the second superconducting layer, as depicted in FIG. 5) in the via.

FIG. 5 illustrates the example, non-limiting chip surface base device structure of FIG. 4 after depositing a tunnel barrier layer in accordance with one or more embodiments described herein. As depicted with chip surface base device structure 500, a tunnel barrier layer has been deposited on chip surface base device structure 400, and this tunnel barrier layer comprises tunnel barrier 510A, tunnel barrier 510B, and tunnel barrier 510C. Thus, like the example chip surface base device structure 300, chip surface base device structure 500 also comprises a tunnel barrier layer, and a difference between chip surface base device structure 300 and chip surface base device structure 500 is that chip surface base device structure 300 has one layer of a superconductor beneath the tunnel barrier layer, and chip surface base device structure 500 has two layers of a superconductor beneath the tunnel barrier layer. Similar to that described with respect to tunnel barrier 308A, tunnel barrier 308B, and tunnel barrier 308C, here, tunnel barrier 510A, tunnel barrier 510B, and tunnel barrier 510C can be aluminum oxide ($Al_2O_3$), a non-superconducting metal, an oxide or a nitride. In some examples, the tunnel barrier 510B can be formed by growth or chemical modification (e.g., oxidation) of the exposed surface (after etch) of superconductor 408B.

Figure 6:
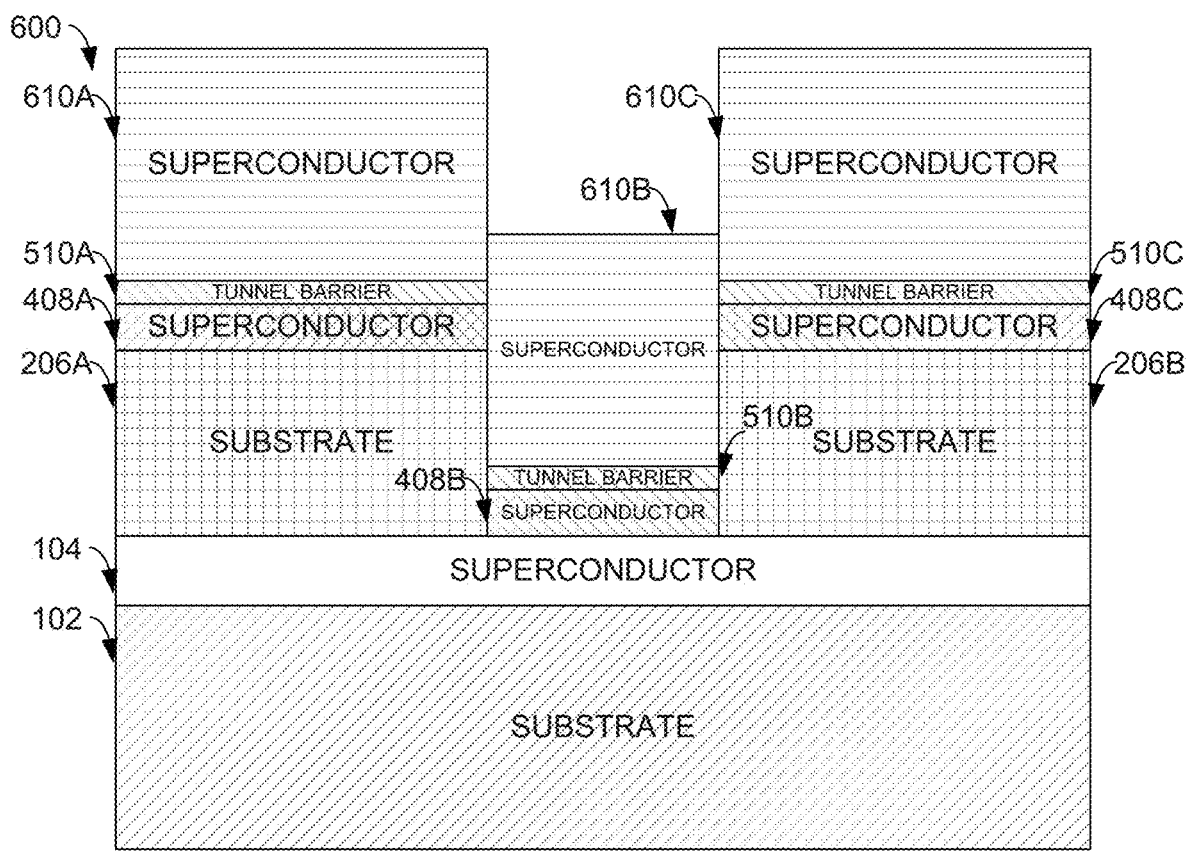
FIG. 6 illustrates the example, non-limiting chip surface base device structure of FIG. 5 after depositing another superconducting layer, which is thicker than the initial height of the via in accordance with one or more embodiments described herein.

FIG. 6 illustrates the example, non-limiting chip surface base device structure of FIG. 5 after depositing another superconducting layer, which is thicker than the initial height of the via in accordance with one or more embodiments described herein. As depicted with chip surface base device structure 600, a third superconducting layer has been deposited onto chip surface base device structure 500, and this third superconducting layer comprises superconductor 610A, superconductor 610B, and superconductor 610C.

While each of superconductor 610A, superconductor 610B, and superconductor 610C are depicted as being distinct, it can be appreciated that this depiction is a logical depiction that is used to highlight the via formed between substrate 206A and substrate 206B, and that superconductor 610A, superconductor 610B, and superconductor 610C can form a contiguous layer of the superconductor. A similar logical depiction is also used with respect to at least some of the other layers depicted in FIGS. 1-11.

By depositing another superconducting layer that is thicker than the initial height of the via, the former top superconducting layer (comprising superconductor 408A and superconductor 408C) is intentionally electrically shorted (directly in contact with). This intentional shorting is done to ensure that the via is completely filled, and this intentional shorting can be addressed later, such as shown with chip surface base device structure 1000, where superconductor 408A and superconductor 408C have been removed. Additionally, depositing tunnel barrier 510A, tunnel barrier 510B, and tunnel barrier 510C (and conversely tunnel barrier 308A, tunnel barrier 308B and tunnel barrier 308C) can result in deposition of a tunnel barrier layer in the sidewall of substrate 206A and substrate 206B. If this sidewall material is not etched back (such as for the isotropic etch back of superconductor 408A, superconductor 408B and superconductor 408C), then there could be a result where superconductor 610B does not electrically short superconductor 408A and superconductor 408C.

In some examples, this third superconducting layer can be a different type of material than either the first superconducting layer or the second superconducting layer. For example, the first superconducting layer can be Ti, the second superconducting layer can be Ta, and the third superconducting layer can be TiN. In some examples, either two or three of these layers are of the same type of layer. In some examples, the third superconducting layer is deposited with a greater thickness than the first superconducting layer and/or the second superconducting layer, and this increased thickness can facilitate a better control of removing part or all of the third superconducting layer at a future time (such as depicted with respect to FIG. 8).

Figure 7:
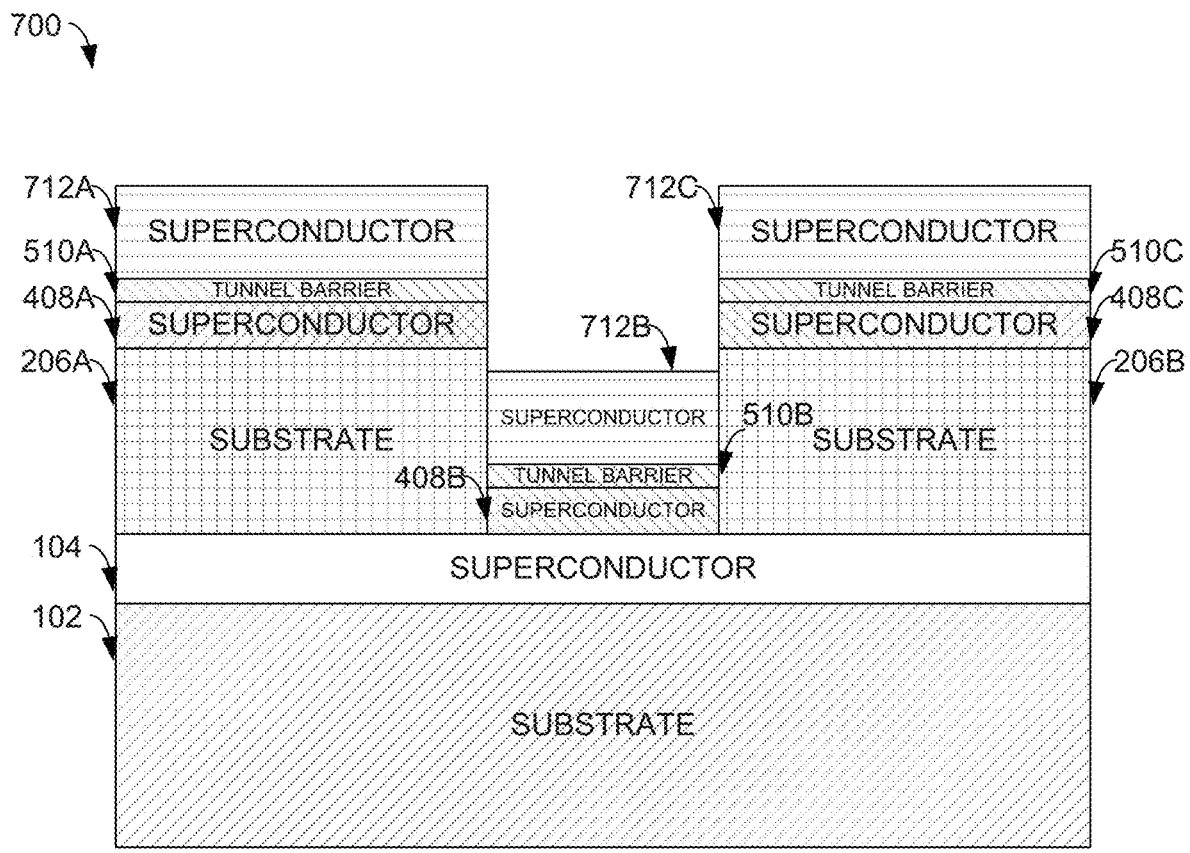
FIG. 7 illustrates the example, non-limiting chip surface base device structure of FIG. 5 after depositing another superconducting layer, which is thinner than the initial height of the via in accordance with one or more embodiments described herein.

FIG. 7 illustrates the example, non-limiting chip surface base device structure of FIG. 5 after depositing another superconducting layer, which is thinner than the initial height of the via in accordance with one or more embodiments described herein. As depicted with chip surface base device structure 700, a third superconducting layer has been deposited onto chip surface base device structure 500, and this third superconducting layer comprises superconductor 712A, superconductor 712B, and superconductor 712C.

Chip surface base device structure 700 can be viewed in contrast to chip surface base device structure 600. As depicted in chip surface base device structure 600, the third superconducting layer is thicker than the initial height of the via formed between substrate 206A and substrate 206B. In contrast, in chip surface base device structure 700, the third superconducting layer is thinner than the initial height of the via formed between substrate 206A and substrate 206B.

Figure 8:
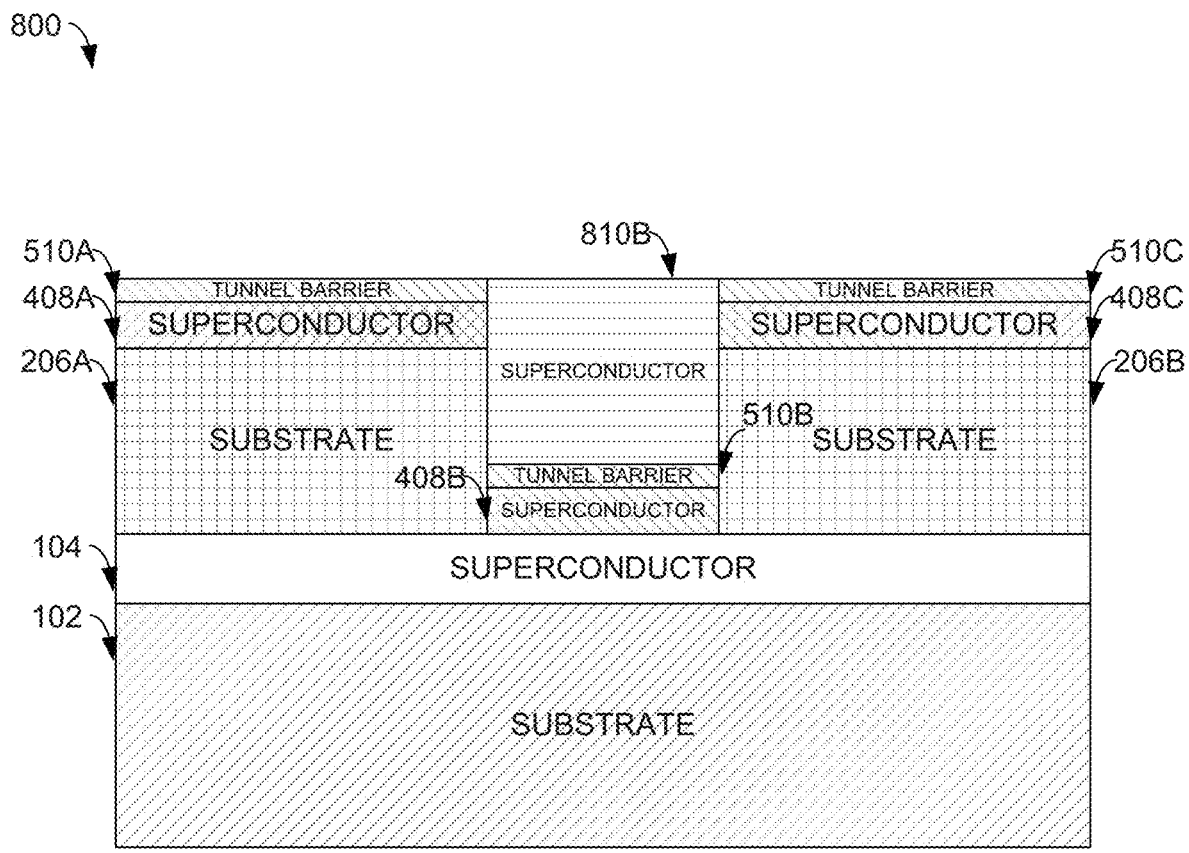
FIG. 8 illustrates the example, non-limiting chip surface base device structure of FIG. 6 after removing material down to the top tunnel barrier layer in accordance with one or more embodiments described herein.

FIG. 8 illustrates the example, non-limiting chip surface base device structure of FIG. 6 after removing material down to the top tunnel barrier layer in accordance with one or more embodiments described herein. As depicted with chip surface base device structure 800, and relative to chip surface base device structure 600, material has been removed down to the height of tunnel barrier 510A and tunnel barrier 510B. This material removed comprises superconductor 610A, some of superconductor 610B (producing superconductor 810B), and superconductor 610C. In some cases, part of tunnel barrier 510A and tunnel barrier 510C may also have been removed.

In some examples, a chemical-mechanical polarization (CMP) process can be utilized to remove this material. It can be appreciated that a similar approach of removing material can be applied to chip surface base device structure 700, where superconductor 712A and superconductor 712C are removed, as well as, in some embodiments, some of superconductor 712B.

Figure 9:
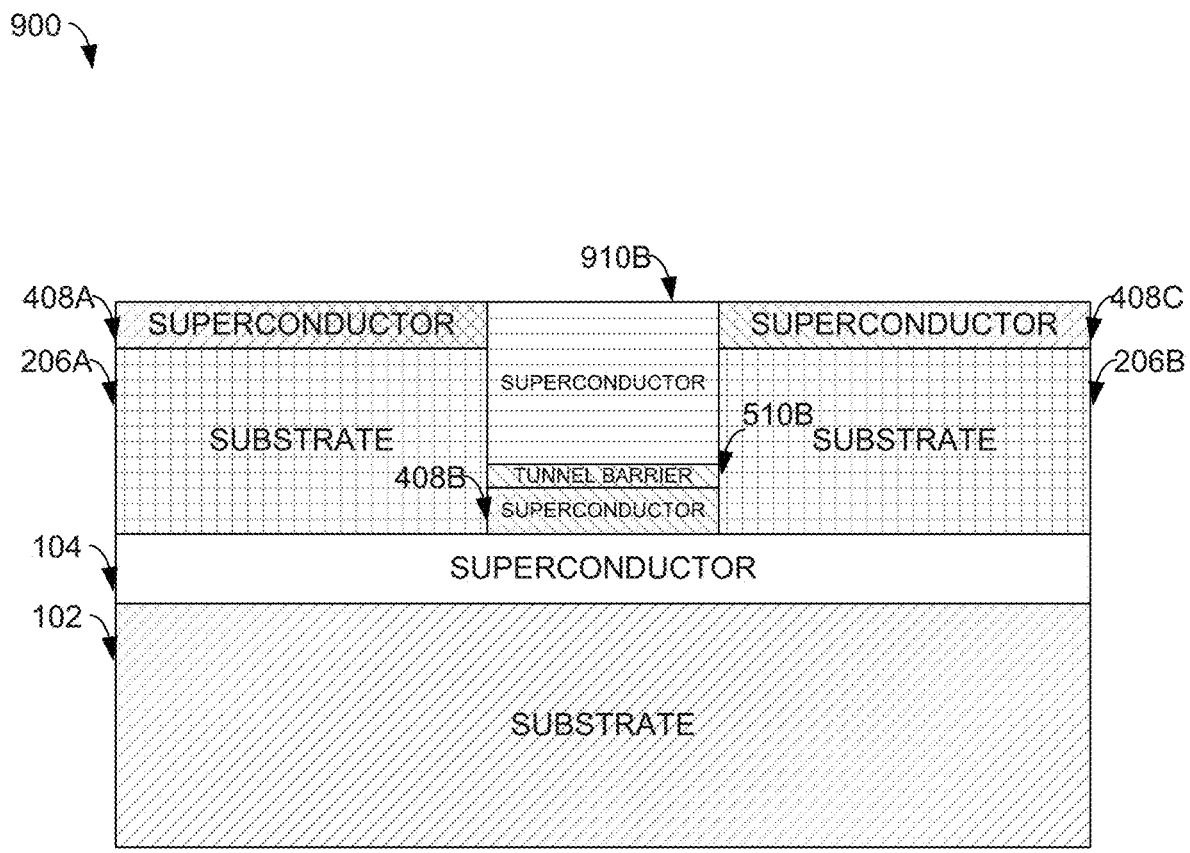
FIG. 9 illustrates the example, non-limiting chip surface base device structure of FIG. 8 after removing the top tunnel barrier layer in accordance with one or more embodiments described herein.

FIG. 9 illustrates the example, non-limiting chip surface base device structure of FIG. 8 after removing the top tunnel barrier layer in accordance with one or more embodiments described herein. As depicted with chip surface base device structure 900, and relative to chip surface base device structure 800, material has been removed down to the height of superconductor 408A and superconductor 408C. This material removed comprises tunnel barrier 510A, tunnel barrier 510C, and some of superconductor 810B (producing superconductor 910B). In some examples, a short-timed CMP process can be utilized to remove this material. In some examples, a short-timed anisotropic etch (such as reactive ion etch, which can be highly selective to oxides such as those used in tunnel barriers) can be utilized to remove this material.

Figure 10:
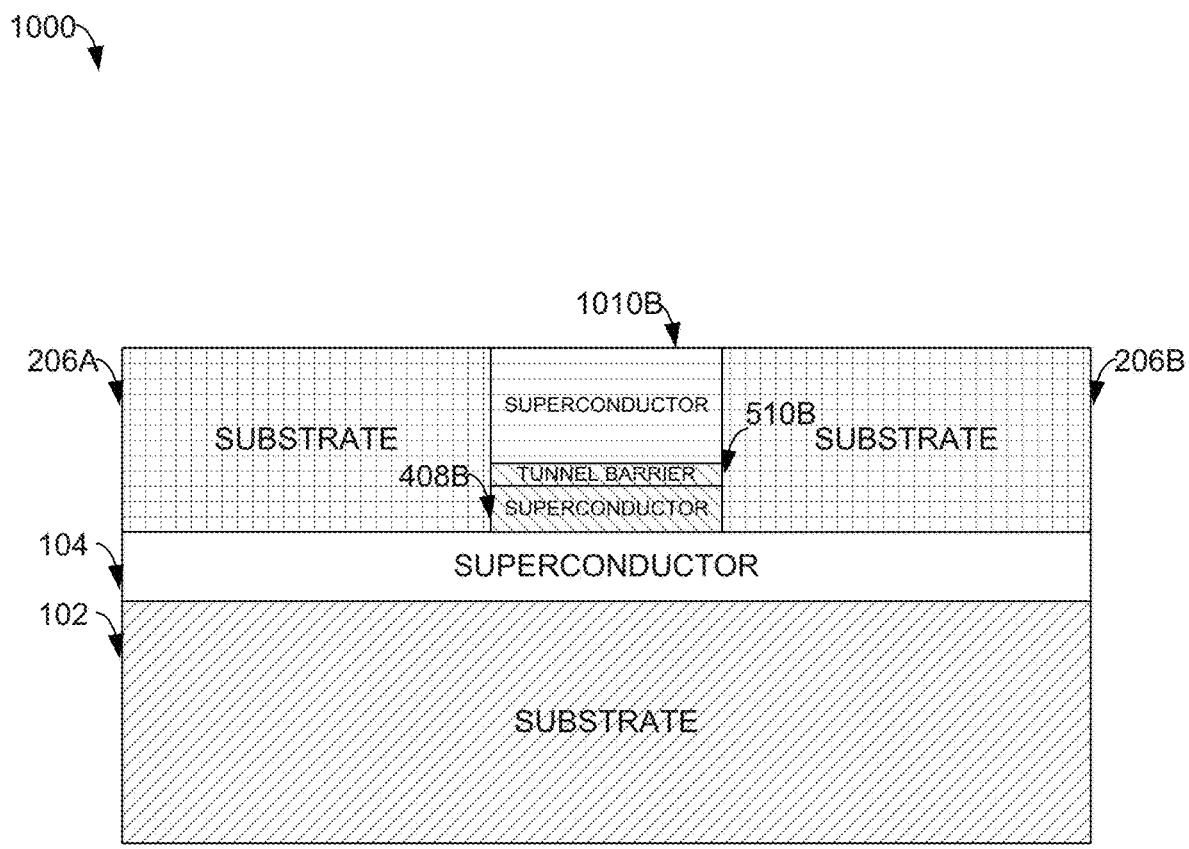
FIG. 10 illustrates the example, non-limiting chip surface base device structure of FIG. 6 or FIG. 7 after removing material down to the top substrate layer in accordance with one or more embodiments described herein.

FIG. 10 illustrates the example, non-limiting chip surface base device structure of FIG. 6 after removing material down to the top substrate layer in accordance with one or more embodiments described herein. As depicted with chip surface base device structure 1000, and relative to chip surface base device structure 900, material has been removed down to the height of substrate 206A and substrate 206B. This material removed comprises superconductor 408A, superconductor 408C, and some of superconductor 910B (producing superconductor 1010B).

In some embodiments, superconductor 1010B can be referred to as a top superconductor, and an electrode of a vertical Josephson junction formed with superconductor 1010B can be referred to as a top electrode of the vertical Josephson junction. While the term "top" can be used to identify these particular features, it can be appreciated that the use of "top" does not require a particular orientation of a vertical Josephson junction. That is, in some examples, the chip surface base device structure of FIG. 10 can be implemented after rotating it 180 degrees, so that what appears at the top of the FIG. would then appear at the bottom of the figure. Further, in some embodiments, a "top" layer can have an additional layer or component or element placed above the layer in some embodiments. All such embodiments are envisaged.

In some examples, a short-timed CMP process can be utilized to remove this material. FIG. 10 also illustrates the example, non-limiting chip surface base device structure of FIG. 7 after removing material down to the top of superconductor 712B in accordance with one or more embodiments described herein.

Figure 11:
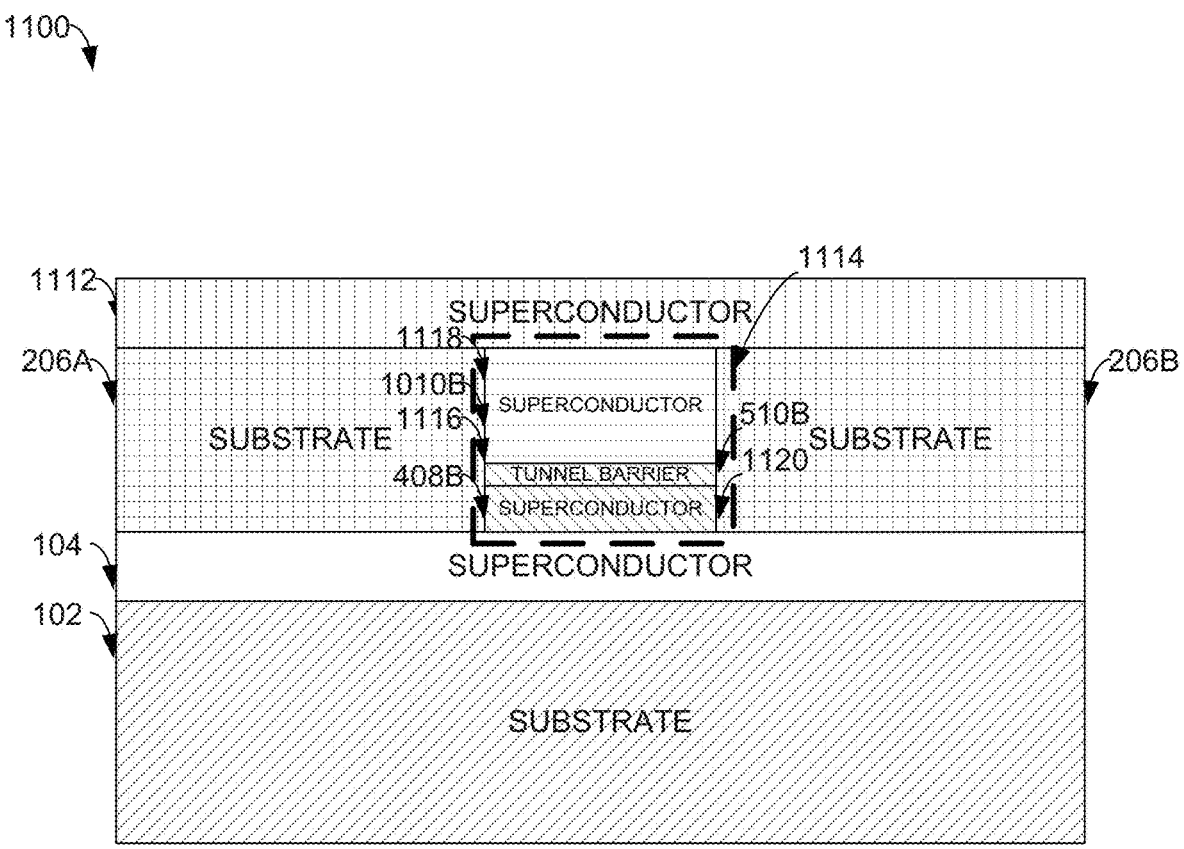
FIG. 11 illustrates the example, non-limiting chip surface base device structure of FIG. 10 after depositing another superconducting layer in accordance with one or more embodiments described herein.

FIG. 11 illustrates the example, non-limiting chip surface base device structure of FIG. 10 after depositing another superconducting layer in accordance with one or more embodiments described herein. As depicted with chip surface base device structure 1100, a fourth superconducting layer has been deposited on chip surface base device structure 1000, and this fourth superconducting layer is depicted here as superconductor 1112.

In some examples, this fourth superconducting layer can be same material type as one or more of the first superconducting layer, the second superconducting layer, and the third superconducting layer. In some examples, the fourth superconducting layer is a different material than the first superconducting layer, the second superconducting layer, and the third superconducting layer. In some examples, this fourth superconducting layer (and/or the second superconducting layer or the third superconducting layer) can comprise Niobium (Nb).

In some examples, vertical Josephson junction 1114 comprises tunnel barrier 510B, first electrode 1120 comprising superconductor 1010B, and top electrode 1118 (located on an opposite side 1116 of the tunnel barrier 510B from superconductor 1010B) comprising superconductor 408B. In some examples, a thickness of the superconductor(s) of the first electrode and a thickness of the superconductor(s) of the second electrode are approximately the same. This thickness can be greater than 100 nm.

In examples where a same superconducting material is used for both the first electrode and for the second electrode, the superconducting gap on each side of the tunnel barrier can be equal, which may be utilized in determining a critical current (the critical current generally identifying a maximum supercurrent that can flow across the Josephson junction). A value for a critical current in a vertical Josephson junction can be based on materials used, and surface areas of those materials in the junction. Creating multiple vertical Josephson junctions where the associated critical current is more reproducible between those vertical Josephson junctions can be based on material type(s) used, thickness of those materials, and a size of an opening of the vertical Josephson junction.

In some examples, multiple vertical Josephson junctions as depicted in chip surface base device structure 1100 can be formed on one wafer. These multiple vertical Josephson junctions can be formed in parallel, and/or sequentially on a wafer.

In some examples, an advantage of a vertical Josephson junction as depicted in chip surface base device structure 1100 is that such a vertical Josephson junction can be reproduced with low variability, and that a variety of materials can be used in fabricating such a vertical Josephson junction.

Figure 12:
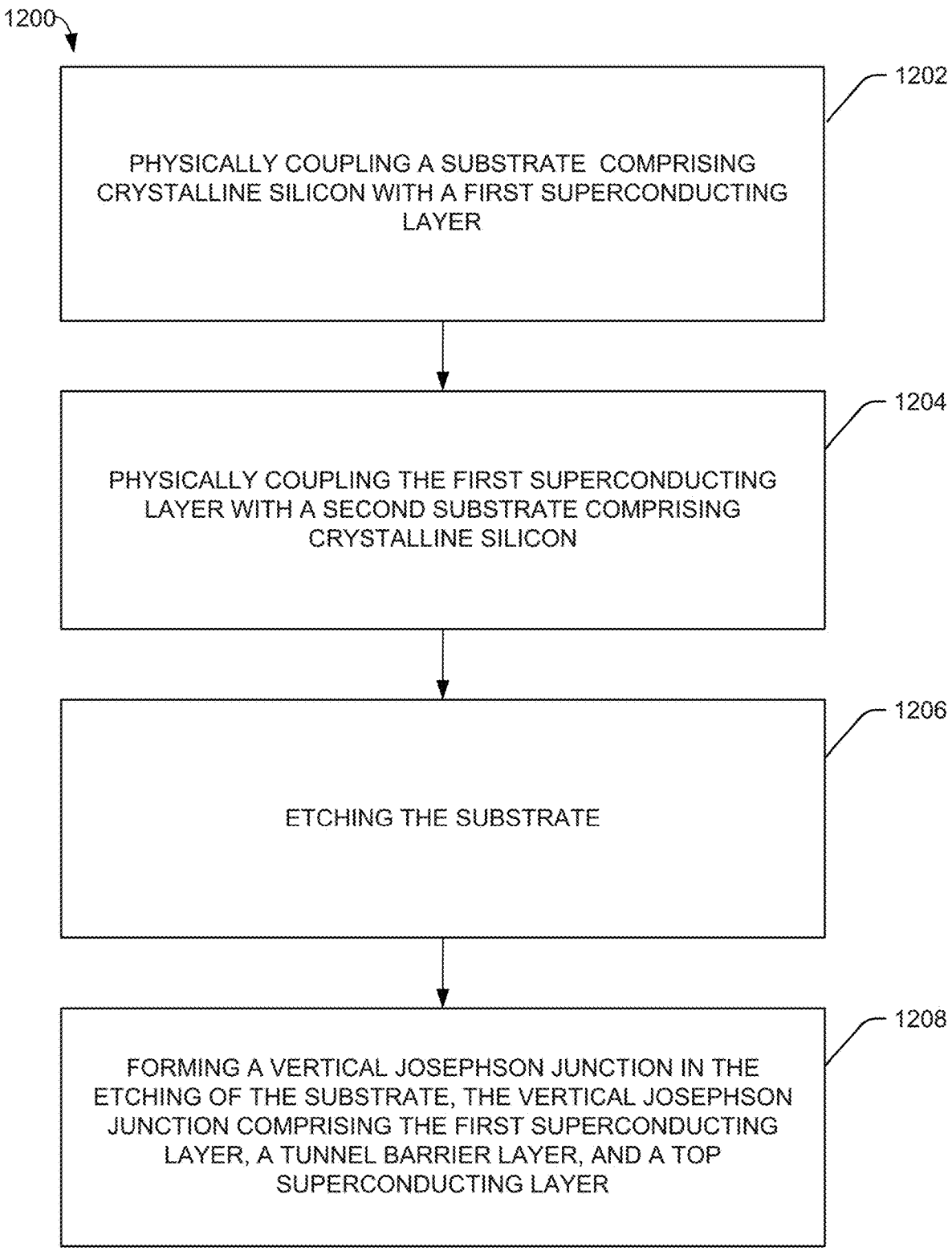
FIG. 12 illustrates a flow diagram of an example, non-limiting computer-implemented method that facilitates implementing a vertical Josephson junction superconducting device in accordance with one or more embodiments described herein.

FIG. 12 illustrates a flow diagram of an example, non-limiting computer-implemented method that facilitates implementing a vertical Josephson junction superconducting device in accordance with one or more embodiments described herein. In some examples, flow diagram 1200 can be implemented by operating environment 1400. It can be appreciated that the operations of flow diagram 1200 can be implemented in a different order than is depicted. It can also be appreciated that the operations of flow diagram 1200 can be implemented in a different order than is depicted.

In non-limiting example embodiments, a computing device (or system) (e.g., computer 1412) is provided comprising one or more processors and one or more memories that stores executable instructions that, when executed by the one or more processors, can facilitate performance of the operations as described herein, including the non-limiting methods as illustrated in the flow diagrams of FIG. 12. As a non-limiting example, the one or more processors can facilitate performance of the methods by directing or controlling one or more equipment operable to perform semiconductor fabrication.

An advantage of a method such as depicted in FIG. 12 can be that it can be used to fabricate vertical Josephson junctions that are more uniform than Josephson junctions fabricated from previous techniques.

Operation 1202 depicts physically coupling (e.g., by computer 1412) a substrate comprising crystalline silicon with a first superconducting layer. Operation 1204 depicts physically coupling (e.g., by computer 1412) the first superconducting layer with a second substrate comprising crystalline silicon. Operation 1206 depicts etching the substrate.

An example of this above arrangement can be seen as chip surface base device structure 100, where the substrate is substrate 106, the first superconducting layer is superconductor 104, and the second substrate is substrate 102. In some examples, a bonding approach is used to physically couple the first substrate, the superconductor, and the second substrate. For example, a first portion of the superconductor can be deposited on the first substrate, and a second portion of the superconductor can be deposited on the second substrate. Then, the first portion of the superconductor and the second portion of the superconductor can be bonded together, thus physically coupling the first substrate, the superconductor, and the second substrate.

In some examples, the substrate has a thickness of 100-200 nanometers (nm). This thickness of 100-200 nm can be obtained by acquiring crystalline silicon wafers with that thickness (such as those grown by a manufacturer), or by acquiring crystalline silicon to a thickness greater than 100-200 nm, and then—after physically coupling the substrate, the superconductor, and the second substrate—removing some of the crystalline silicon so that its thickness is then 100-200 nm.

An advantage of using crystalline silicon can be that crystalline silicon can be a material that is suitable for forming a vertical Josephson junction as described herein. Crystalline silicon has a low loss tangent in the microwave regime, which can make it suitable for superconducting quantum circuits, which can rely on Josephson junctions as an essential circuit element.

Operation 1208 depicts forming (e.g., by computer 1412) a vertical Josephson junction in an etching of the substrate, the vertical Josephson junction comprising a tunnel barrier layer and a top superconducting layer.

An example of this arrangement of operation 1208 can be seen as chip surface base device structure 900 and as chip surface base device structure 1100. With chip surface base device structure 900, the vertical Josephson junction can be the combination of superconductor 408B, tunnel barrier MOB, and superconductor 910B. In some examples, superconductor 408B and superconductor 910B can be said to be arranged on opposite sides of tunnel barrier 510B. Then, superconductor 408B can be considered to be an electrode of the vertical Josephson junction, and superconductor 910B can be considered to be another electrode of the vertical Josephson junction.

With chip surface base device structure 1100, the vertical Josephson junction can be the combination of superconductor 408B, tunnel barrier 510B, and superconductor 1010B. Then, superconductor 408B can be considered to be an electrode of the vertical Josephson junction, and superconductor 910B can be considered to be another electrode of the vertical Josephson junction.

In some examples, in operation 1208, the etching of the substrate comprises a via. This via can be seen, for example, with chip surface base device structure 200, where the via can be the space between substrate 206A and substrate 206C.

In some examples, in operation 1208, the tunnel barrier layer is deposited onto the first superconducting layer or a second superconducting layer. This former arrangement can be seen, for example, with chip surface base device structure 300, where the tunnel base layer can be tunnel barrier 308B, and it is deposited directly onto superconductor 104, which can be the first superconducting layer. Regarding being the tunnel barrier layer being deposited on a second superconducting layer, this latter arrangement can be seen, for example, with chip surface base device structure 500 where the tunnel base layer can be tunnel barrier 510B, and it is deposited on superconductor 408B, which can be the second superconducting layer.

In some examples, in operation 1208, the vertical Josephson junction comprises a third superconducting layer that is deposited between the first superconducting layer and the tunnel barrier layer. This arrangement can be seen, for example, with chip surface base device structure 500, where the tunnel base layer can be tunnel barrier 510B, the first superconducting layer can be superconductor 104, and the second superconducting layer can be superconductor 408B.

In some examples, in operation 1208, the first superconducting layer and the second superconducting layer each comprise an electrode of the vertical Josephson junction. This arrangement can be seen, for example, with chip surface base device structure 1100, where the first superconducting layer can be superconductor 408B, and the second superconducting layer can be superconductor 1010B.

In some examples, in operation 1208, the tunnel barrier layer is deposited by sputtering, evaporating, atomic layer deposition (ALD), growth or chemical modification (for example, oxidation) of the superconductor 104 or 408B. That is, depositing the tunnel barrier layer can be effectuated by performing the process within a group consisting of sputtering, evaporating, atomic layer deposition, and chemical modification. Sputtering is generally depositing a first material onto a second material by bombarding the second material with particles of the first material. Evaporating is generally evaporating a first material in a vacuum, where vapor particles of the first material travel to a second material, and condense to a solid state on the second material. ALD is generally utilizing a gas phase chemical process to deposit a film of a second material onto a first material. Oxidation as an example of chemical modification can generally involve introducing a partial pressure of oxygen into a chamber containing the substrate in order to create an oxide of the exposed material.

In some examples, in operation 1208, the second superconducting layer is deposited between the second substrate and the tunnel barrier layer. This arrangement can be seen, for example, with chip surface base device structure 500, where the second superconducting layer can be superconductor 408B, the second substrate can be substrate 102, and the tunnel barrier layer can be tunnel barrier 510B.

In some examples, in operation 1208, a height of the second superconducting layer is shorter than an initial height of the etching of the substrate. This arrangement can be seen, for example, with chip surface base device structure 700, where the second superconducting layer can be superconductor 712B, the initial height of the etching of the substrate is a height of what was etched from substrate 106 to form substrate 206A and substrate 206B, and the height of superconductor 712B is less than a height of what was etched from substrate 106 to form substrate 206A and substrate 206B.

In some examples, in operation 1208, the second superconducting layer and the third superconducting layer are of a different type. For example, with regard to chip surface base device structure 700, the second superconducting layer can be superconductor 408B, and the third superconducting layer can be superconductor 712B. In such an example, superconductor 408B can be a first type of superconducting material, and superconductor 712B can be a second type of superconducting material.

In some examples, in operation 1208, a chemical-mechanical planarization (CMP) is used to remove a portion of the second superconducting layer. For example, with regard to chip surface base device structure 600, the second superconducting layer can be the combination of superconductor 610A, superconductor 610B, and superconductor 610C. Then, a way in which chip surface base device structure 800 differs from chip surface base device structure 600 is that in chip surface base device structure 800 and relative to chip surface base device structure 600, superconductor 610A has been removed, a portion of superconductor 610B has been removed, and superconductor 610C has been removed. A CMP that can be used in this removal generally can be an approach to smoothing a surface, or removing material from a surface, with a combined approach of chemical and mechanical forces.

In some examples, in operation 1208, the vertical Josephson junction is formed within a via, and the via is formed using a mask and reactive ion etch (RIE). For example, with regard to the chip surface base device structure 1100, the vertical Josephson junction can comprise superconductor 408B, tunnel barrier 510B, and superconductor 1010B. This vertical Josephson junction is formed within a via, which can be a space created between substrate 206A and substrate 206B (where the space was created from substrate 106 in chip surface base device structure 100). This via can be formed using a mask and RIE. A mask can generally be a material or substance that is formed into a shape such that a defined portion of a semiconductor is exposed when a process is applied to add, remove, or modify material in the semiconductor (and another defined portion of the semiconductor is protected by the mask such that this process does not add, remove, or modify material to this protected portion). A RIE can generally be an approach that utilizes chemically reactive plasma to remove material.

In some examples, in operation 1208, CMP is utilized (or performed) to remove a portion of the tunnel barrier layer that is located outside of the via. For example, between chip surface base device structure 800 and chip surface base device structure 900, some tunnel barrier layer (tunnel barrier 510A and tunnel barrier 510C) is removed. Removing tunnel barrier 510A and tunnel barrier 510C can be effectuated with CMP.

In some examples, in operation 1208, CMP is utilized (or performed) to remove a portion of the second superconducting layer that is located outside of the via. For example, the second superconducting layer can be the combination of superconductor 408A and superconductor 408C (and can also include superconductor 910B). Between chip surface base device structure 900 and chip surface base device structure 1000, a portion of this second superconducting layer is removed (which is depicted as all of superconductor 408A, some of superconductor 910B, and all of superconductor 408C being removed to form chip surface base device structure 1000). Removing all of superconductor 408A, some of superconductor 910B, and all of superconductor 408C can be effectuated with CMP.

In some examples, in operation 1208, a third superconducting layer is deposited on the second substrate after removing the portion of the second superconducting layer that is located outside of the via.

For example, chip surface base device structure 1100 can include superconductor 1112 as the third superconducting layer, and the second substrate can be substrate 206A and substrate 206C. Superconductor 1112 can be deposited on substrate 206A and substrate 206C, after superconductor 408A, part of superconductor 910B, and superconductor 408C (as depicted in chip surface base device structure 900) have been removed from chip surface base device structure 900 to produce chip surface base device structure 1000 (with chip surface base device structure 1100 being created from chip surface base device structure 1000 through depositing superconductor 1112).

FIG. 13 illustrates another flow diagram of an example, non-limiting computer-implemented method that facilitates implementing a vertical Josephson junction superconducting device in accordance with one or more embodiments described herein. In some examples, flow diagram 1300 can be implemented by operating environment 1400. It can be appreciated that the operations of flow diagram 1300 can be implemented in a different order than is depicted.

In non-limiting example embodiments, a computing device (or system) (e.g., computer 1412) is provided comprising one or more processors and one or more memories that stores executable instructions that, when executed by the one or more processors, can facilitate performance of the operations as described herein, including the non-limiting methods as illustrated in the flow diagrams of FIG. 13. As a non-limiting example, the one or more processors can facilitate performance of the methods by directing or controlling one or more equipment operable to perform semiconductor fabrication.

An advantage of a method as depicted in FIG. 13 can be that it can be used to fabricate vertical Josephson junctions that are more uniform than Josephson junctions fabricated from previous techniques.

Operation 1302 depicts bonding (e.g., by computer 1412) a first portion of a superconducting layer that is physically coupled to a crystalline silicon substrate with a second portion of the superconducting layer that is physically coupled with a second crystalline silicon substrate, the superconducting layer, and the second substrate comprising a SOM base.

For example, a first portion of the superconductor can be deposited on the first substrate, and a second portion of the superconductor can be deposited on the second substrate. Then, the first portion of the superconductor and the second portion of the superconductor can be bonded together, thus physically coupling the first substrate, the superconductor, and the second substrate.

An example of this arrangement of operation 1302 can be seen as chip surface base device structure 100, where the substrate is substrate 106, the first superconducting layer is superconductor 104, and the second substrate is substrate 102. In some examples, the substrate has a thickness of 100-200 nanometers (nm). This thickness of 100-200 nm can be obtained by growing crystalline silicon to that thickness, or by growing crystalline silicon to a thickness greater than 100-200 nm, and then—after physically coupling the substrate, the superconductor, and the second substrate—removing some of the crystalline silicon so that its thickness is then 100-200 nm.

An advantage of using bonding to connect the substrate with the first superconducting layer, and the first superconducting layer with the second substrate can be to electrically isolate components of a chip surface base device structure, such as a vertical Josephson junction formed in the chip surface base device structure.

Operation 1304 depicts forming (e.g., by computer 1412) a vertical Josephson junction in an etching of the crystalline silicon substrate, the vertical Josephson junction comprising the superconducting layer, a tunnel barrier layer, and a second superconducting layer.

An example of this arrangement of operation 1304 can be seen as chip surface base device structure 900 and as chip surface base device structure 1100. With chip surface base device structure 900, the vertical Josephson junction can be the combination of superconductor 408B, tunnel barrier 510B, and superconductor 910B. Then, superconductor 408B can be considered to be an electrode of the vertical Josephson junction, and superconductor 910B can be considered to be another electrode of the vertical Josephson junction.

With chip surface base device structure 1100, the vertical Josephson junction can be the combination of superconductor 408B, tunnel barrier 510B, and superconductor 1010B. Then, superconductor 408B can be considered to be an electrode of the vertical Josephson junction, and superconductor 910B can be considered to be another electrode of the vertical Josephson junction.

In some examples, in operation 1304, the etching of the substrate comprises a via. This via can be seen, for example, with chip surface base device structure 200, where the via can be the space between substrate 206A and substrate 206C.

In some examples, in operation 1304, the tunnel barrier layer is deposited onto the first superconducting layer or a second superconducting layer. This former arrangement can be seen, for example, with chip surface base device structure 300, where the tunnel base layer can be tunnel barrier 308B, and it is deposited directly onto superconductor 104, which can be the first superconducting layer. Regarding being the tunnel barrier layer being deposited on a second superconducting layer, this latter arrangement can be seen, for example, with chip surface base device structure 500 where the tunnel base layer can be tunnel barrier 510B, and it is deposited on superconductor 408B, which can be the second superconducting layer.

In some examples, in operation 1304, the vertical Josephson junction comprises a second superconducting layer that is deposited between the first superconducting layer and the tunnel barrier layer. This arrangement can be seen, for example, with chip surface base device structure 500, where the tunnel base layer can be tunnel barrier 510B, the first superconducting layer can be superconductor 104, and the second superconducting layer can be superconductor 408B.

In some examples, in operation 1304, the first superconducting layer and the second superconducting layer each comprise an electrode of the vertical Josephson junction. This arrangement can be seen, for example, with chip surface base device structure 1100, where the first superconducting layer can be superconductor 408B, and the second superconducting layer can be superconductor 1010B.

In some examples, in operation 1304, the tunnel barrier layer is deposited by sputtering, evaporating, or ALD.

In some examples, in operation 1304, the second superconducting layer is deposited between the first superconducting layer and the tunnel barrier layer. This arrangement can be seen, for example, with chip surface base device structure 500, where the second superconducting layer can be superconductor 408B, the first superconducting layer can be superconductor 104, and the tunnel barrier layer can be tunnel barrier 510B.

In some examples, in operation 1304, a height of the second superconducting layer is shorter than an initial height of the etching of the substrate. This arrangement can be seen, for example, with chip surface base device structure 700, where the second superconducting layer can be superconductor 712B, the initial height of the etching of the substrate is a height of what was etched from substrate 106 to form substrate 206A and substrate 206B, and the height of superconductor 712B is less than a height of what was etched from substrate 106 to form substrate 206A and substrate 206B.

In some examples, in operation 1304, the second superconducting layer and the third superconducting layer are of a different type. For example, with regard to chip surface base device structure 700, the second superconducting layer can be superconductor 408B, and the third superconducting layer can be superconductor 712B (which each comprise an electrode of a vertical Josephson junction). In such an example, superconductor 408B can be a first type of superconducting material, and superconductor 712B can be a second type of superconducting material.

In some examples, in operation 1304, a CMP is used to remove a portion of the third superconducting layer. For example, with regard to chip surface base device structure 600, the third superconducting layer can be the combination of superconductor 610A, superconductor 610B, and superconductor 610C. Then, a way in which chip surface base device structure 800 differs from chip surface base device structure 600 is that in chip surface base device structure 800 and relative to chip surface base device structure 600, superconductor 610A has been removed, a portion of superconductor 610B has been removed, and superconductor 610C has been removed.

In some examples, in operation 1304, the vertical Josephson junction is formed within a via, and the via is formed using a mask and RIE. For example, with regard to the chip surface base device structure 1100, the vertical Josephson junction can comprise superconductor 408B, tunnel barrier 510B, and superconductor 1010B. This vertical Josephson junction is formed within a via, which can be a space created between substrate 206A and substrate 206B (where the space was created from substrate 106 in chip surface base device structure 100). This via can be formed using a mask and RIE.

In some examples, in operation 1304, CMP is utilized to remove a portion of the tunnel barrier layer that is located outside of the via. For example, between chip surface base device structure 800 and chip surface base device structure 900, some tunnel barrier layer (tunnel barrier 510A and tunnel barrier 510C) is removed. Removing tunnel barrier 510A and tunnel barrier 510C can be effectuated with CMP.

In some examples, in operation 1304, CMP is utilized remove a portion of the second superconducting layer that is located outside of the via. For example, the second superconducting layer can be the combination of superconductor 408A and superconductor 408C (and can also include superconductor 910B). Between chip surface base device structure 900 and chip surface base device structure 1000, a portion of this second superconducting layer is removed (which is depicted as all of superconductor 408A, some of superconductor 910B, and all of superconductor 408C being removed to form chip surface base device structure 1000). Removing all of superconductor 408A, some of superconductor 910B, and all of superconductor 408C can be effectuated with CMP.

In some examples, in operation 1304, a third superconducting layer is deposited on the substrate after removing the portion of the second superconducting layer that is located outside of the via.

For example, chip surface base device structure 1100 can include superconductor 1112 as the fourth superconducting layer, and the substrate can be substrate 206A and substrate 206B. Superconductor 1112 can be deposited on substrate 206A and substrate 206B, after superconductor 408A, part of superconductor 910B, and superconductor 408C (as depicted in chip surface base device structure 900) have been removed from chip surface base device structure 900 to produce chip surface base device structure 1000 (with chip surface base device structure 1100 being created from chip surface base device structure 1000 through depositing superconductor 1112).

Figure 14:
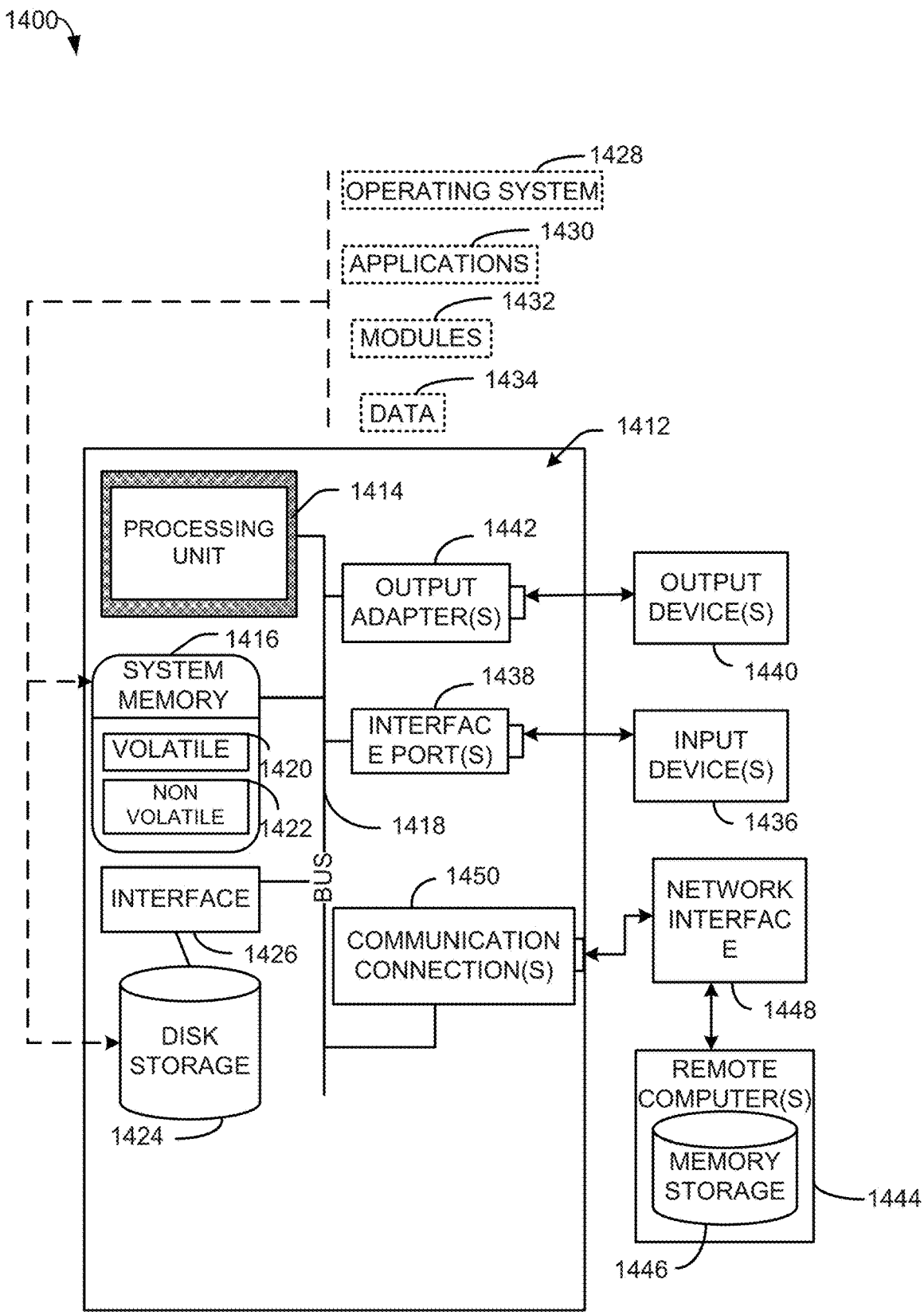
FIG. 14 illustrates a block diagram of an example, non-limiting operating environment in which one or more embodiments described herein can be facilitated.

In order to provide a context for the various aspects of the disclosed subject matter, FIG. 14 as well as the following discussion are intended to provide a general description of a suitable environment in which the various aspects of the disclosed subject matter can be implemented. For example, operating environment 1400 can be used to implement aspects of the example, non-limiting computer-implemented methods that facilitates implementing a vertical Josephson junction superconducting device of FIGS. 12 and 13.

FIG. 14 illustrates a block diagram of an example, non-limiting operating environment in which one or more embodiments described herein can be facilitated. Repetitive description of like elements employed in other embodiments described herein is omitted for sake of brevity. With reference to FIG. 14, a suitable operating environment 1400 for implementing various aspects of this disclosure can also include a computer 1412. The computer 1412 can also include a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414. The system bus 1418 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1416 can also include volatile memory 1420 and nonvolatile memory 1422. The basic input/output system (BIOS), containing the basic routines to transfer information between elements within the computer 1412, such as during start-up, is stored in nonvolatile memory 1422. By way of illustration, and not limitation, nonvolatile memory 1422 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1420 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1412 can also include removable/non-removable, volatile/nonvolatile computer storage media. FIG. 14 illustrates, for example, a disk storage 1424. Disk storage 1424 can also include, but is not limited to, devices like a magnetic disk drive, floppy disk drive, tape drive, Jaz drive, Zip drive, LS-100 drive, flash memory card, or memory stick. The disk storage 1424 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1424 to the system bus 1418, a removable or non-removable interface is typically used, such as interface 1426. FIG. 14 also depicts software that acts as an intermediary between users and the basic computer resources described in the suitable operating environment 1400. Such software can also include, for example, an operating system 1428. Operating system 1428, which can be stored on disk storage 1424, acts to control and allocate resources of the computer 1412.

System applications 1430 take advantage of the management of resources by operating system 1428 through program modules 1432 and program data 1434, e.g., stored either in system memory 1416 or on disk storage 1424. It is to be appreciated that this disclosure can be implemented with various operating systems or combinations of operating systems. A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436. Thus, for example, a USB port can be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a means of connection between the output device 1440 and the system bus 1418. It should be noted that other devices and/or systems of devices provide both input and output capabilities such as remote computer(s) 1444.

Computer 1412 can operate in a networked environment using logical connections to one or more remote computers, such as remote computer(s) 1444. The remote computer(s) 1444 can be a computer, a server, a router, a network PC, a workstation, a microprocessor based appliance, a peer device or other common network node and the like, and typically can also include many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1450 refers to the hardware/software employed to connect the network interface 1448 to the system bus 1418. While communication connection 1450 is shown for illustrative clarity inside computer 1412, it can also be external to computer 1412. The hardware/software for connection to the network interface 1448 can also include, for exemplary purposes only, internal and external technologies such as, modems including regular telephone grade modems, cable modems and DSL modems, ISDN adapters, and Ethernet cards.

The present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A chip surface base device structure, comprising:
a substrate that is physically coupled with a first superconducting layer; and
a vertical Josephson junction located in an etched region of the substrate, the vertical Josephson junction comprising the first superconducting layer, a tunnel barrier layer, and a top superconducting layer, wherein the vertical Josephson junction comprises a third superconducting layer that is deposited above the tunnel barrier layer.

2. The chip surface base device structure of claim 1, further comprising:
a via in the etched region of the substrate.

3. The chip surface base device structure of claim 1, wherein the tunnel barrier layer is located on at least one of the first superconducting layer, or a second superconducting layer that is physically coupled with the first superconducting layer.

4. The chip surface base device structure of claim 1, wherein the first superconducting layer comprises a first electrode of the vertical Josephson junction, and the top superconducting layer located on an opposite side of the tunnel barrier layer from the first superconducting layer comprises a top electrode of the vertical Josephson junction.

5. The chip surface base device structure of claim 1, wherein the vertical Josephson junction comprises a first electrode comprising the first superconducting layer or a second superconducting layer, and a second electrode comprising the top superconducting layer.

6. The chip surface base device structure of claim 1, wherein the third superconducting layer is deposited above the first superconducting layer and the tunnel barrier layer or above a second superconducting layer and the tunnel barrier layer.

7. A method, comprising:
physically coupling a substrate with a first superconducting layer;
etching the substrate;
forming a vertical Josephson junction in the etching of the substrate, the vertical Josephson junction comprising the first superconducting layer, a tunnel barrier layer, and a top superconducting layer, wherein the forming the vertical Josephson junction comprises:
depositing a second superconducting layer between the first superconducting layer and the tunnel barrier layer, wherein portions of the second superconducting layer are separated by a gap.

8. The method of claim 7, wherein the forming the vertical Josephson junction further comprises:
depositing the tunnel barrier layer by performing the process within a group consisting of sputtering, evaporating, atomic layer deposition, growth, chemical modification, and oxidation.

9. The method of claim 7, wherein a height of the second superconducting layer is shorter than a second height of the etching of the substrate, wherein the second height comprises an initial height of the etching of the substrate upon forming the etching.

10. The method of claim 7, wherein the forming the vertical Josephson junction further comprises:
depositing a third superconducting layer on the tunnel barrier layer.

11. The method of claim 10, wherein the second superconducting layer and the third superconducting layer are of a different type.

12. The method of claim 10, wherein the forming the vertical Josephson junction further comprises:
performing chemical-mechanical planarization to remove a portion of the third superconducting layer.

13. The method of claim 7, further comprising:
forming a via employing a mask and a reactive ion etch; and
forming the vertical Josephson junction within the via.

14. A chip surface base device structure, comprising:
a substrate adjacent to a first superconducting layer; and
a vertical Josephson junction located in an etched region of the substrate, the vertical Josephson junction comprising the first superconducting layer, a tunnel barrier layer, and a top superconducting layer, wherein the vertical Josephson junction comprises a third superconducting layer that is deposited above the tunnel barrier layer.

15. The chip surface base device structure of claim 14, wherein the tunnel barrier layer is formed on the first superconducting layer.

16. The chip surface base device structure of claim 14, wherein the vertical Josephson junction comprises a second superconducting layer that is located above the first superconducting layer and below the tunnel barrier layer.

17. The chip surface base device structure of claim 16, wherein the first superconducting layer and the second superconducting layer comprise an electrode of the vertical Josephson junction.

18. The chip surface base device structure of claim 14, wherein the vertical Josephson junction comprises a first electrode comprising the first superconducting layer or a second superconducting layer, and a second electrode comprising the top superconducting layer.

19. The chip surface base device structure of claim 14, wherein the vertical Josephson junction comprises a first electrode comprising the first superconducting layer or a second superconducting layer, and a second electrode comprising the top superconducting layer.

20. The chip surface base device structure of claim 14, wherein the third superconducting layer is deposited above the first superconducting layer and the tunnel barrier layer or above a second superconducting layer and the tunnel barrier layer.

* * * * *